(12) United States Patent
Suzuki et al.

(10) Patent No.: US 7,196,393 B2
(45) Date of Patent: Mar. 27, 2007

(54) SEMICONDUCTOR DEVICE INCLUDING A HIGH VOLTAGE TRANSISTOR

(75) Inventors: Mitsuhiro Suzuki, Ibaraki (JP); Minoru Morinaga, Takatsuki (JP); Yukihiro Inoue, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/072,310

(22) Filed: Mar. 7, 2005

(65) Prior Publication Data

US 2005/0199962 A1 Sep. 15, 2005

(30) Foreign Application Priority Data

Mar. 12, 2004 (JP) .............................. 2004-070784

(51) Int. Cl.
*H01L 29/00* (2006.01)
(52) U.S. Cl. ...................... 257/502; 257/372; 257/500; 257/E27.064
(58) Field of Classification Search ................. 257/500, 257/502, 372, E21.135, E27.064
See application file for complete search history.

(56) References Cited

U.S. PATENT DOCUMENTS

| | | | | |
|---|---|---|---|---|
| 5,512,769 | A * | 4/1996 | Yamamoto | 257/339 |
| 6,404,009 | B1 * | 6/2002 | Mori | 257/335 |
| 6,784,490 | B1 * | 8/2004 | Inoue et al. | 257/344 |
| 6,841,837 | B2 * | 1/2005 | Inoue | 257/409 |

FOREIGN PATENT DOCUMENTS

| | | |
|---|---|---|
| EP | 0 337 823 A2 | 10/1989 |
| JP | 1-264262 | 10/1989 |
| JP | 7-245410 | 9/1995 |
| JP | 8-236754 | 9/1996 |
| JP | 9-223793 | 8/1997 |

OTHER PUBLICATIONS

Japanese Office Action issued in corresponding Japanese Patent Application No. JP 2004-070784, dated Nov. 8, 2006.

* cited by examiner

*Primary Examiner*—Andy Huynh
(74) *Attorney, Agent, or Firm*—McDermott Will & Emery LLP

(57) ABSTRACT

A drain diffusion layer 11*b* includes a low impurity concentration region 5*a* and a high impurity concentration region 5*b*, and the low impurity concentration region 5*a* is located on the channel region side. An impurity layer 7 having an opposite conductivity type to the drain diffusion layer 11*b* is formed in the channel region, at a position away from the low impurity concentration region 5*a* by a distance T. Alternatively, the low impurity concentration region 5*a* and the impurity layer 7 are located so as to contact each other. Still alternatively, a border impurity layer is provided between the low impurity concentration region 5*a* and the impurity layer 7. Thus, a semiconductor device including a high voltage transistor capable of suppressing the reduction of the electric current driving capability and performing stable driving, and a method for fabricating the same, can be provided.

6 Claims, 7 Drawing Sheets

SEMICONDUCTOR DEVICE INCLUDING A HIGH VOLTAGE TRANSISTOR

BACKGROUND OF THE INVENTION

1. Field of the Invention

The present invention relates to a semiconductor device and a method for fabricating the same, and more specifically to a semiconductor device including a high voltage transistor having an offset structure and a method for fabricating the same.

2. Description of the Background Art

High voltage transistors having an offset structure are known as transistors having stabilized withstand voltage and leak characteristics (for example, FIG. 6 of Japanese Laid-Open Patent Publication No. 9-223793). In such a high voltage transistor, a drain diffusion layer includes an impurity region located on the side of the gate electrode (hereinafter, referred to as a "low impurity concentration region") and a region having an impurity concentration higher than that of the low impurity concentration region (hereinafter, referred to as a "high impurity concentration region"). Device isolation is performed, for example, by LOCOS (Local Oxidation of Silicon) or using a trench structure by STI (Shallow Trench Isolation).

FIG. 6 is a cross-sectional view of a semiconductor device including a MOS type transistor processed with device isolation by LOCOS and having an offset structure. In FIG. 6, a semiconductor substrate includes a semiconductor base 1 used as a base for forming a high voltage transistor 20d, and a first conductivity type well diffusion layer 2 formed thereon. On a surface of the well diffusion layer 2, LOCOS oxide films 6a and 6b are formed as insulating films for device isolation.

A second conductivity type source diffusion layer 11a is formed in the well diffusion layer 2 so as to contact the LOCOS oxide film 6a. A second conductivity type drain diffusion layer 11b includes a low impurity concentration region 5a and a high impurity concentration region 5b. The low impurity concentration region 5a is located on the side of the source diffusion layer 11a (i.e., the low impurity concentration region 5a is closer to the source diffusion layer 11a than the high impurity concentration region 5b is) and below the LOCOS oxide film 6b. The low impurity concentration region 5a having such a structure is also referred to as an "offset drain diffusion layer".

A region in the well diffusion layer 2 between the source diffusion layer 11a and the drain diffusion layer 11b is to act as a channel region (hereinafter, referred to as a "channel region"). A first conductivity type impurity layer 15 is formed so as to overlap the channel region and the source diffusion layer 11a. A gate insulating film 8 is formed above the channel region, and a gate electrode 9 is formed on the gate insulating film 8.

The impurity layer 15 is a threshold voltage adjusting impurity layer for adjusting the threshold voltage of the high voltage transistor 20d. The impurity layer 15 is formed by introducing a first conductivity impurity into the source diffusion layer 11a and the channel region by ion implantation or the like and thermally diffusing the introduced impurity. Owing to the impurity layer 15 formed in the channel region, it is possible to apply a high voltage to the gate electrode 9 or the drain diffusion layer 11b.

However, the high voltage transistor 20d having the above-described structure has a serious problem in that the electric current driving capability is easily lowered. The circled part in FIG. 6 represented with the arrow is an enlarged view of a part of the LOCOS oxide film 6b on the channel region side. As shown in the circled part, an end of the impurity layer 15 overlaps an end of the low impurity concentration region 5a. Hereinafter, the portion where the impurity layer 15 and the low impurity concentration region 5a overlap each other will be referred to as an "overlapping portion 30". The impurity layer 15 and the low impurity concentration region 5a have opposite conductivity types to each other. Accordingly, in the overlapping portion 30, the concentration of the carriers contributing to the conduction is lowered and a parasitic resistance is generated, resulting in a high resistance. This lowers the electric current driving capability of the high voltage transistor.

Japanese Laid-Open Patent Publication No. 9-223793 proposes a technique of providing another impurity layer in the channel region of the semiconductor device having the above-described structure in order to solve the above problem. FIG. 7 is a cross-sectional view of a semiconductor device having such a structure. In FIG. 7, in the channel region of a semiconductor device having substantially the same structure as that of the semiconductor device shown in FIG. 6, a high impurity concentration region 40 having the same conductivity type as that of the drain diffusion layer 11b is formed. The high impurity concentration region 40 is formed, after the impurity layer 15 is formed, by introducing an impurity having the same conductivity type as that of the drain diffusion layer 11b into the channel region and thermally diffusing the impurity.

In a high-voltage transistor 20e having such a structure, the impurity of the impurity region 15 compensates for the impurity of the low impurity concentration layer 5a and extends a depletion layer 60 in the overlapping portion 30. Therefore, the high withstand voltage of the drain diffusion layer 11b or the gate electrode 9 can be guaranteed. Moreover, since the threshold voltage is adjusted to a desired level by the high impurity concentration layer 40, the electric current driving capability of the high voltage transistor 20e can be improved.

However, the above-described technique has the following problem. When forming the impurity layer 15 and the high impurity concentration layer 40, the impurity distribution in the depth direction of the semiconductor substrate is controlled by the thermal diffusion. The impurity concentration of the impurity layer 15 needs to be controlled so as to obtain the depletion layer 60 as desired in the overlapping portion 30. It is, however, difficult to control the impurity concentration to be an appropriate level by thermal diffusion. In addition, the impurity layer 15 and the high impurity concentration region 40 overlap each other in the channel region, which makes it difficult to control the concentration of a surface part of the channel region.

SUMMARY OF THE INVENTION

Therefore, an object of the present invention is to provide a semiconductor device in which the impurity concentration at an end of a low impurity concentration region of a drain diffusion layer and in the channel region is easily controlled, a high withstand voltage of the drain diffusion layer or the gate electrode is guaranteed, and reduction in the electric current driving capability of the transistor can be suppressed; and a method for fabricating such a semiconductor device.

The present invention has the following features to attain the object mentioned above.

A first aspect of the present invention is directed to a semiconductor device including a high voltage transistor.

The semiconductor device comprises a semiconductor substrate having a first conductivity type surface portion; a second conductivity type source diffusion layer, a drain diffusion layer, and a first conductivity type impurity layer which are formed in the semiconductor substrate; and a gate electrode and a gate insulating film provided on the semiconductor substrate. The drain diffusion layer includes a second conductivity type low impurity concentration region formed on the side of the source diffusion layer and a second conductivity type high impurity concentration region having a higher impurity concentration than that of the low impurity concentration region. An insulating film for device isolation may be provided in the semiconductor substrate, and the low impurity concentration region may be an offset drain diffusion layer formed below the insulating film.

One feature of the semiconductor device according to the present invention is that the low impurity concentration region and the impurity layer are positioned so as not to compensate for the impurity of each other. With such a structure, the low impurity concentration region can be prevented from being compensated for by the impurity of the impurity layer. As a result, the generation of a parasitic resistance is restricted and thus the reduction in the electric current driving capability can be suppressed. In addition, a high voltage can be applied to the gate electrode and the drain diffusion layer.

The structure in which the low impurity concentration region and the impurity layer are positioned so as not to compensate for the impurity of each other means a structure in which, for example, the low impurity concentration region and the impurity layer are discrete from each other or contact each other. A second conductivity type border impurity layer may be further provided between the low impurity concentration region and the impurity layer.

A second aspect of the present invention is directed to a method for fabricating a semiconductor device having the above-described structure. According to the method, first, a second conductivity type impurity is introduced into a semiconductor substrate having a first conductivity type surface portion, thereby forming a low impurity concentration region in the semiconductor substrate. Next, a pair of insulating films for device isolation are formed in the semiconductor substrate, such that one of the pair of insulating films is on the low impurity concentration region. Then, a resist pattern is formed on the one of the pair of insulating films formed on the low impurity concentration region, the resist pattern also covering a part of a region which is to act as a channel region. Next, a first conductivity type impurity is introduced into the semiconductor substrate using the resist pattern and the insulating films as a mask, thereby forming an impurity layer at a position which is in the semiconductor substrate and is discrete from the low impurity concentration region. Then, the resist pattern is removed, and a gate insulating film is formed on the region which is to act as the channel region in the semiconductor substrate. A gate electrode is formed on the gate insulating film. A second conductivity type impurity is introduced into the semiconductor substrate using the pair of insulating films and the gate electrode as a mask, thereby forming a source diffusion layer and a drain diffusion layer in the semiconductor substrate.

After the step of forming the gate electrode, the impurity contained in the impurity layer and the impurity contained in the low impurity concentration region may be diffused by thermal treatment in a direction along a main surface of the semiconductor substrate until the impurities contact each other.

The present invention also provides another method for fabricating a semiconductor device. According to this method, first, a second conductivity type impurity is introduced into a semiconductor substrate having a first conductivity type surface portion, thereby forming a low impurity concentration region in the semiconductor substrate. Next, a pair of insulating films for device isolation are formed in the semiconductor substrate, such that one of the pair of insulating films is on the low impurity concentration region. Then, a first conductivity type impurity is introduced into the semiconductor substrate using the pair of insulating films as a mask, thereby forming an impurity layer. Next, a resist pattern is formed on the semiconductor substrate, the resist pattern having an opening at least above a part of a region which is to act as a channel region, the part being on the side of the low impurity concentration region. A second conductivity type impurity is introduced into the semiconductor substrate using the resist pattern as a mask, thereby forming a border impurity layer in the semiconductor substrate. Then, the resist pattern is removed. A gate insulating film is formed on the region which is to act as the channel region. A gate electrode is formed on the gate insulating film. Then, a second conductivity type impurity is introduced into the semiconductor substrate using the pair of insulating films and the gate electrode as a mask, thereby forming a source diffusion layer and a drain diffusion layer in the semiconductor substrate.

By such fabrication methods, the impurity concentration at an end of a low impurity concentration region of a drain diffusion layer and in the channel region is easily controlled. A semiconductor device including a high voltage transistor having a superb electric current driving capability can be easily fabricated.

As described above, according to the present invention, the low impurity concentration region of the drain diffusion layer and the impurity layer having an opposite conductivity type to that of the low impurity concentration region formed in the channel region are positioned so as not to compensate for the impurity of each other. Thus, a semiconductor device including a high voltage transistor, which allows a high voltage to be applied to the gate electrode or the drain diffusion layer and suppresses the reduction in the electric current driving capability in the channel region, and a method for fabricating the same, can be provided.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
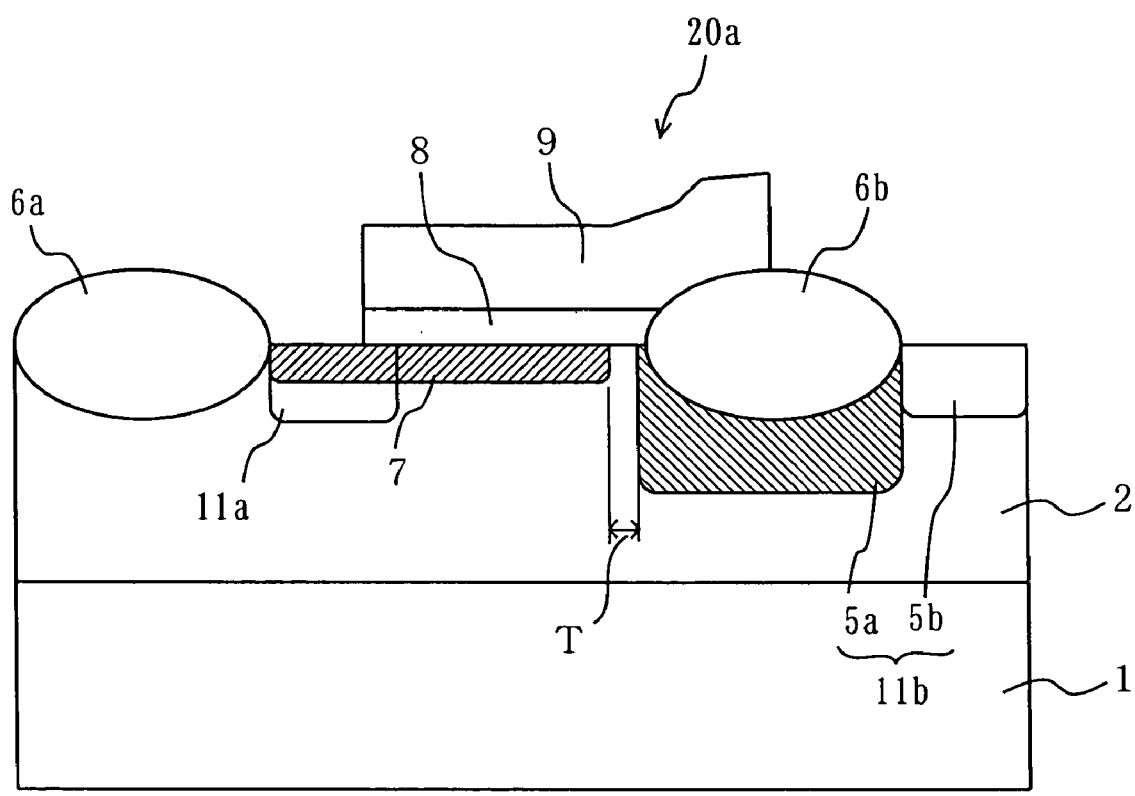
FIG. 1 is a cross-sectional view showing a structure of a semiconductor device according to Embodiment 1 of the present invention.

FIG. 1 is a cross-sectional view of a structure of a semiconductor device according to Embodiment 1 of the present invention, including a MOS type transistor processed with device isolation by LOCOS and having an offset structure. In FIG. 1, a semiconductor substrate has a first conductivity type impurity surface portion. Here, the semiconductor substrate includes a semiconductor base 1 used as a base for forming a high voltage transistor 20a, and a first conductivity type well diffusion layer 2 formed thereon. On a surface of the well diffusion layer 2, LOCOS oxide films 6a and 6b are formed as insulating films for device isolation.

A second conductivity type source diffusion layer 11a is formed in the well diffusion layer 2 so as to contact the LOCOS oxide film 6a. A second conductivity type drain diffusion layer 11b includes a low impurity concentration region 5a and a high impurity concentration region 5b. The low impurity concentration region 5a is located on the side of the source diffusion layer 11a and below the LOCOS oxide film 6b. The low impurity concentration region 5a having such a structure is also referred to as an "offset drain diffusion layer".

An impurity layer 7 is formed by introducing an impurity of an opposite conductivity type to that of the low concentration impurity region 5a, i.e., a first conductivity type impurity, into the source diffusion layer 11a and the channel region by ion implantation or the like. The impurity layer 7 is a threshold voltage adjusting impurity layer for adjusting the threshold voltage of the high voltage transistor 20a. On the channel region, a gate electrode 9 is formed with a gate insulating film 8 interposed therebetween.

Figure 6:
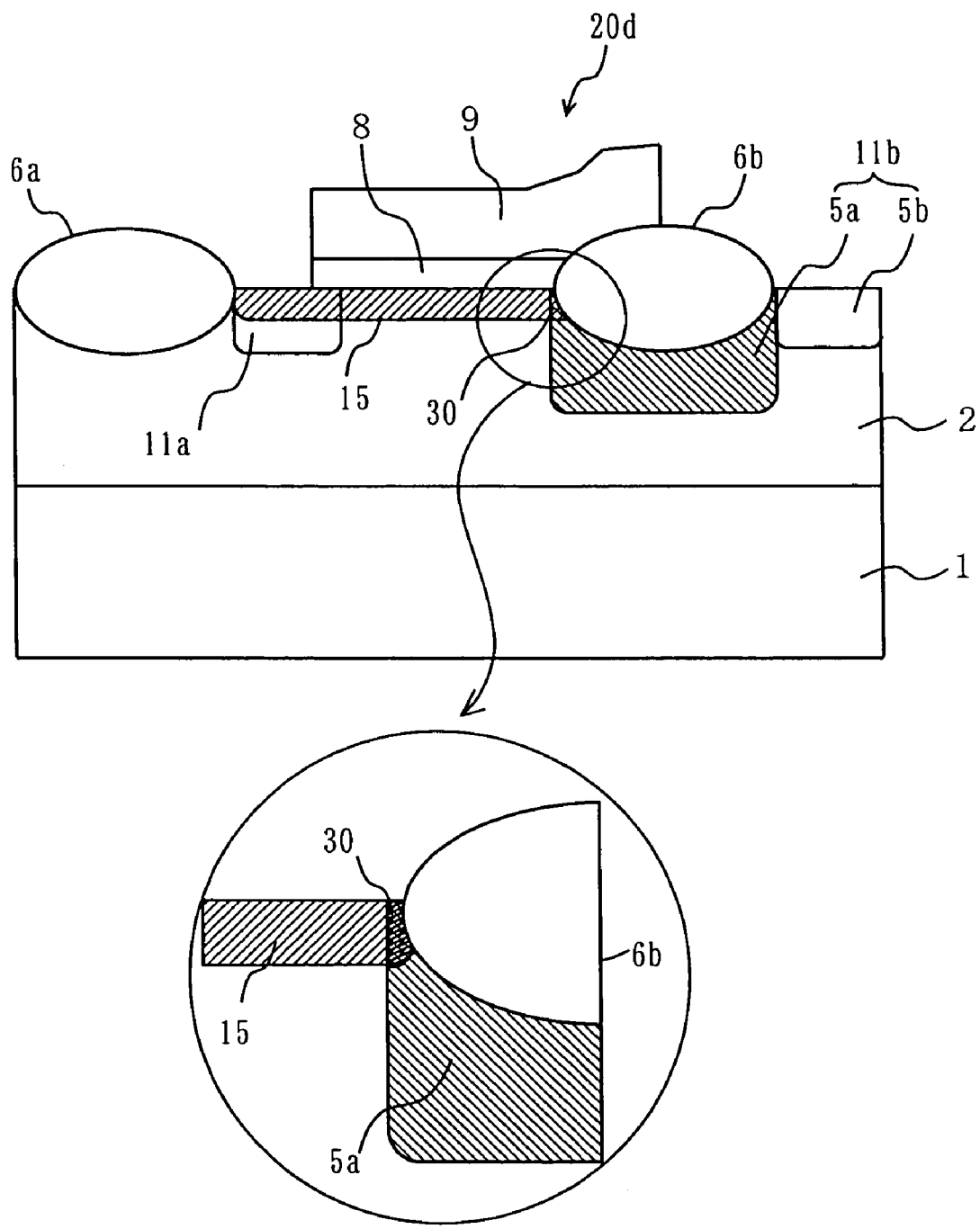
FIG. 6 is a cross-sectional view showing a structure of a conventional semiconductor device.
Figure 7:
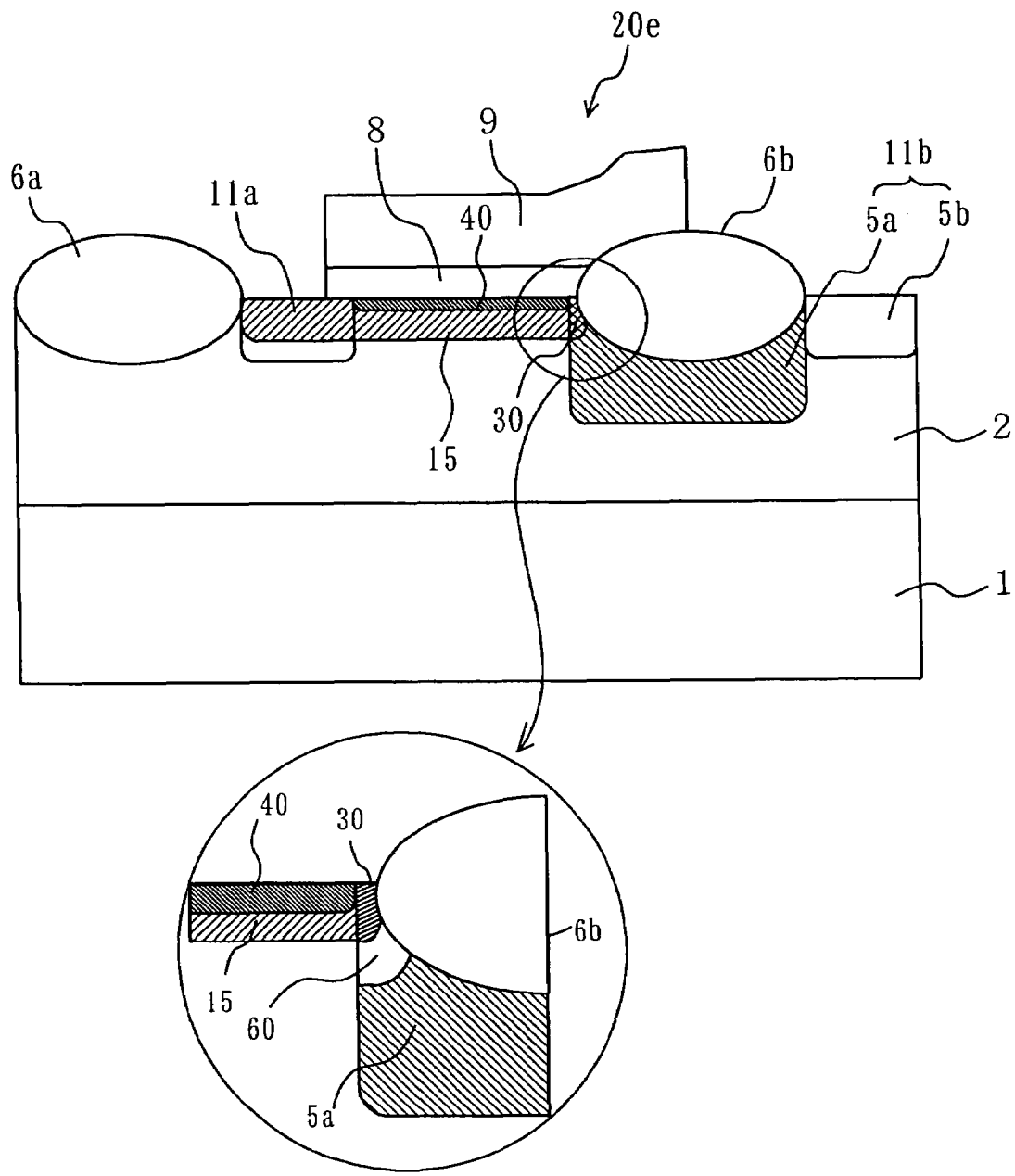
FIG. 7 is a cross-sectional view showing a structure of another conventional semiconductor device.

In the semiconductor device according to this embodiment, unlike the conventional semiconductor devices shown in FIG. 6 and FIG. 7, the impurity layer 7 and the low impurity concentration region 5a are positioned so as not to compensate for the impurity of each other, i.e., are discrete from each other with a distance T therebetween. Owing to such a positional relationship between the impurity layer 7 and the low impurity concentration region 5a, the overlapping portion 30 which is the problem of the conventional art is eliminated. Therefore, the problem of generation of the parasitic resistance at an end of the low impurity concentration region 5a on the channel region side can be solved.

Owing to the impurity layer 7 provided in the channel region, the threshold voltage can be adjusted to a desired level, and thus the electric current driving capability of the high voltage transistor 20a can be improved. Since the offset drain diffusion layer is formed, a high voltage can be applied to the gate electrode 9 or the drain diffusion layer 11b. Since only the impurity layer 7 is formed in the channel region, it is easy to control the concentration of a surface part of the channel region.

FIGS. 2A through 2E are cross-sectional views of a semiconductor substrate and elements formed thereon in steps of fabrication of the semiconductor device shown in FIG. 1. Hereinafter, with reference to FIGS. 2A through 2E, a method for fabricating the semiconductor device according to Embodiment 1 will be described.

Figure 2A:
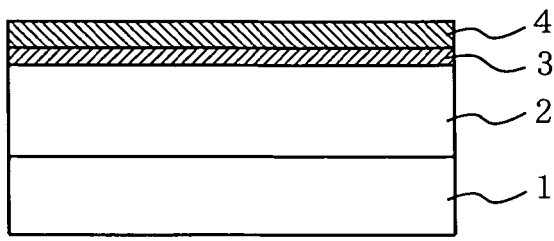
FIGS. 2A through 2E are views showing the steps of fabrication of the semiconductor device shown in FIG. 1.

FIG. 2A shows a state where a silicon oxide film and a silicon nitride film are formed on the semiconductor substrate. Such a structure is obtained as follows. On the surface of the semiconductor base 1 of P type, the well diffusion layer 2 of P type is formed. Next, on the surface of the well diffusion layer 2, an $SiO_2$ (silicon oxide) film 3 and an SiN (silicon nitride) film 4 are sequentially deposited by oxidization or CVD (Chemical Vapor Deposition).

Figure 2B:
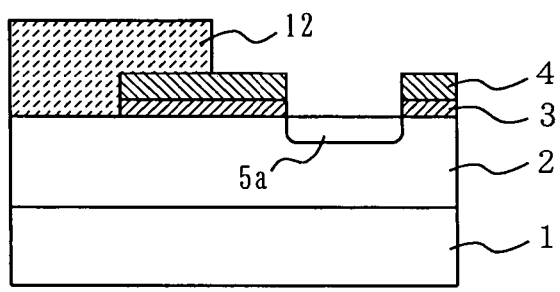

FIG. 2B shows a state where a mask pattern for forming the low impurity concentration region 5a is formed on the semiconductor substrate. Such a structure is obtained as follows. The $SiO_2$ film 3 and the SiN film 4 are treated with, for example, photolithography and dry etching, thereby forming openings at positions where LOCOS oxide films 6a and 6b are to be formed. Then, a resist is applied so as to keep the opening on the side where the drain diffusion layer 11b is to be formed and cover the other opening, thereby forming a resist film. The resist film is treated with exposure and development, thereby forming a resist pattern 12 patterned into a desired shape. Using the $SiO_2$ film 3, the SiN film 4 and the resist pattern 12 which have been patterned as above as a mask, ions of an N type impurity (e.g., phosphorus, arsenic, antimony) are implanted into the well diffusion layer 2. Thus, the low impurity concentration region 5a is formed in the well diffusion layer 2.

Figure 2C:
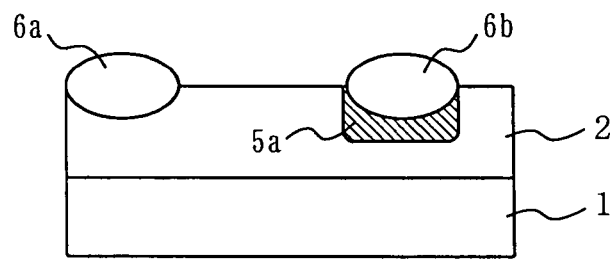

FIG. 2C shows a state where the LOCOS oxide films 6a and 6b are formed at the surface of the well diffusion layer 2. Such a structure is obtained as follows. The resist pattern 12 is removed. The resultant structure is thermally treated at a temperature of 1000° C., thereby thermally oxidizing the surface of the well diffusion layer 2 using the SiN film 4 as an anti-oxidation mask and also thermally diffusing the N type impurity of the low impurity concentration region 5a. Thus, the LOCOS oxide films 6a and 6b having a thickness of about 70 nm are formed at the surface of the well diffusion layer 2, and concurrently, the low impurity concentration region 5a is made deeper. The SiN film 4 and the $SiO_2$ film 3 are removed by etching.

Figure 2D:
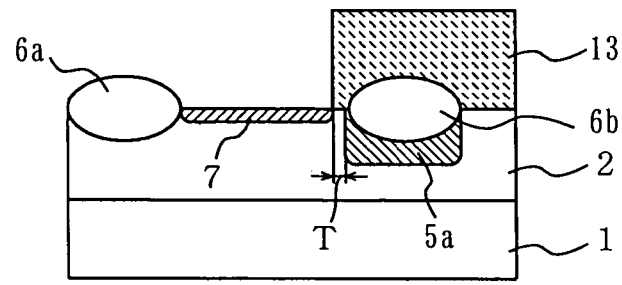

FIG. 2D shows a state where a resist pattern 13 patterned into a desired shape is formed on the semiconductor substrate and the impurity layer 7 is formed in the well diffusion layer 2. Such a structure is obtained as follows. The resist pattern 13 is formed on the LOCOS oxide film 6b so as to also cover a part of the channel region. Using the resist pattern 13 and the LOCOS oxide film 6a as a mask, ions of a P type impurity (e.g., boron, aluminum) are implanted into the well diffusion layer 2. Thus, the impurity layer 7 is formed in the well diffusion layer 2, at a position discrete from the low impurity concentration region 5a by a distance T.

Figure 2E:
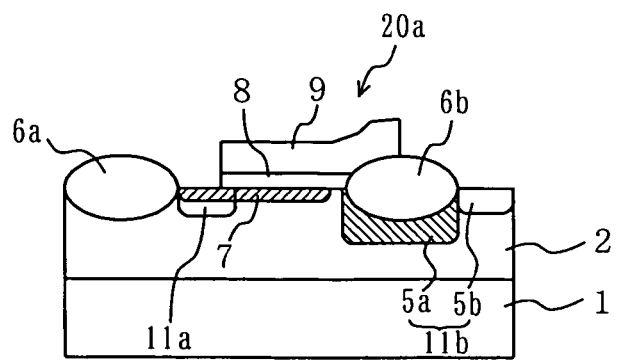

FIG. 2E shows a state where the source diffusion layer 11a and the drain diffusion layer 11b are formed in the well diffusion layer 2, and the gate insulating film 8 and the gate electrode 9 are formed on the semiconductor substrate. Such a structure is obtained as follows. First, the resist pattern 13 is removed. Next, an $SiO_2$ film is deposited by thermal oxidation or CVD on the surface of the well diffusion layer 2 between the LOCOS oxide films 6a and 6b. On the $SiO_2$ film, a polysilicon film is deposited by CVD. These films are treated with photolithography and dry etching, thereby patterning each of the films into a desired shape. Thus, the gate insulating film 8 and the gate electrode 9 are formed.

Next, using the gate electrode 9 and the LOCOS oxide films 6a and 6b as a mask, ions of an N type impurity are implanted into the well diffusion layer 2, thereby forming the high impurity concentration region 5b and the source diffusion layer 11a. Thus, the high voltage transistor 20a having an offset structure is formed.

Representative surface impurity concentrations of the high voltage transistor 20a having the above-described structure are: in the well diffusion layer 2, about $3\times10^{15}$ atoms/cm$^3$; in the low impurity concentration region 5a, about $5\times10^{16}$ atoms/cm$^3$; in the source diffusion layer 11a and the high impurity concentration region 5b, about $5\times10^{20}$ atoms/cm$^3$; and in the impurity layer 7, about $1\times10^{17}$ atoms/cm$^3$.

Now, the distance T between the impurity layer 7 and the low impurity concentration region 5a, which is one feature of the semiconductor device according to this embodiment, will be described in detail. In FIG. 1, the distance T between the low impurity concentration region 5a and the impurity layer 7 is, for example, equal to or less than about 1 μm. The reason is that where the distance between the region 5a and the layer 7 is equal to or less than about 1 μm, the threshold voltage is low and thus does not likely to cause a resistance increase.

In addition, a portion is formed between the impurity layer 7 and the low impurity concentration region 5a, into which the impurity for threshold voltage adjustment is not implanted. Therefore, the P type impurity of the low impurity concentration region 5a and the N type impurity of the impurity layer 7 do not compensate for each other. This suppresses the reduction in the carrier concentration at an end of the low impurity concentration region 5a on the channel region side and thus realizes a transistor having a high electric current driving capability.

Figure 3:
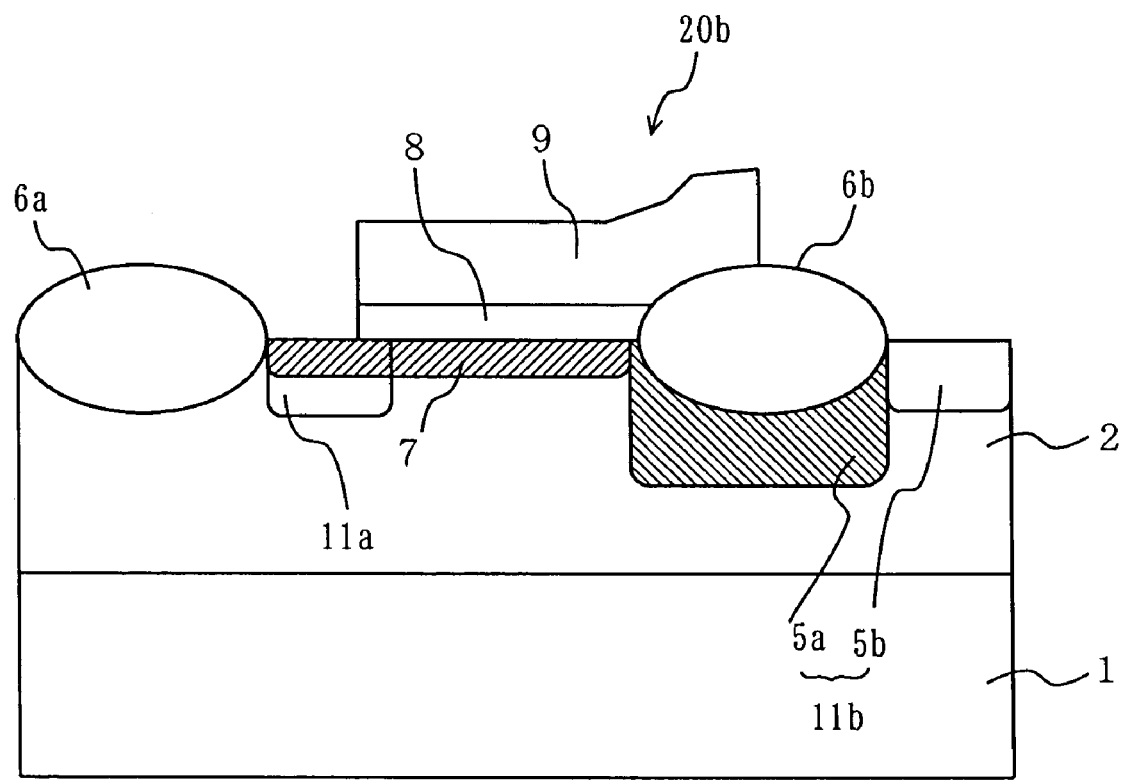
FIG. 3 is a cross-sectional view showing a structure of another semiconductor device according to Embodiment 1 of the present invention.

As shown in FIG. 3, the low impurity concentration region 5a and the impurity layer 7 may contact each other. The semiconductor device shown in FIG. 3 is obtained as follows. In the step shown in FIG. 2E, the impurities contained in the impurity layer 7 and the low impurity concentration region 5a are diffused by thermal treatment in a direction along a main surface of the semiconductor substrate, and the impurity layer 7 and the low impurity concentration region 5a are put into contact with each other. Such a structure can be easily realized by controlling the degree of thermal treatment in a preferable manner.

In a high-voltage transistor 20b having such a structure, there is no distance between the low impurity concentration region 5a and the impurity layer 7. Since the threshold voltage is low in a portion where the distance between the region 5a and the layer 7 is equal to or less than about 1 μm as described above, the resistance is not likely to be increased.

In the above description, the impurity layer 7 overlaps the channel region and the source diffusion layer 11a. However, the impurity layer 7 is only required to be formed in the channel region in order to act as a threshold voltage adjusting impurity layer.

Embodiment 2

In this embodiment, a semiconductor device including a border impurity layer provided between the low impurity concentration region 5a and the impurity layer 7 will be described. The semiconductor device according to this embodiment has substantially the same structure as that of the semiconductor device according to Embodiment 1, and only differences will be described below.

Figure 4:
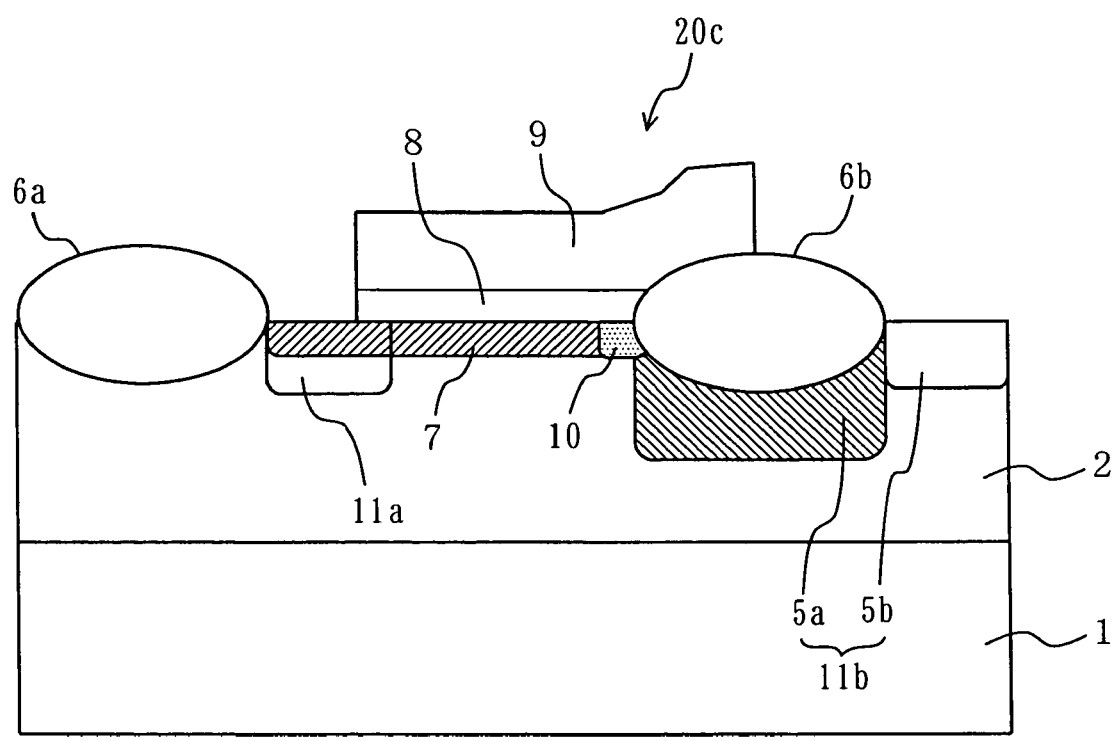
FIG. 4 is a cross-sectional view showing a structure of a semiconductor device according to Embodiment 2 of the present invention.

FIG. 4 is a cross-sectional view of a structure of a semiconductor device according to Embodiment 2 of the present invention. In FIG. 4, a second conductivity type border impurity layer 10 is provided between the low impurity concentration region 5a and the impurity layer 7.

Figure 5A:
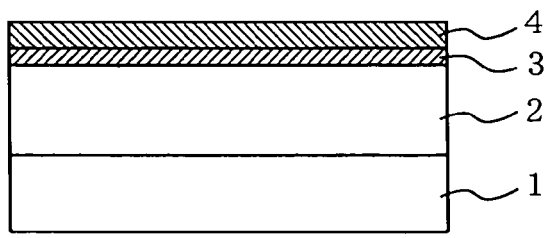
FIGS. 5A through 5E are views showing the steps of fabrication of the semiconductor device shown in FIG. 4.
Figure 5B:
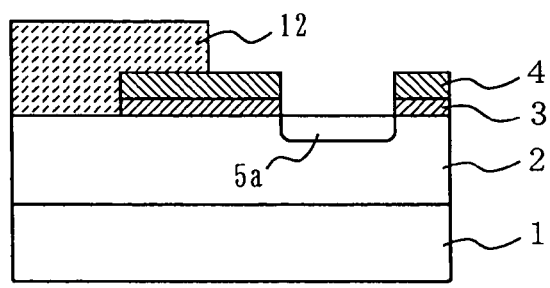
Figure 5C:
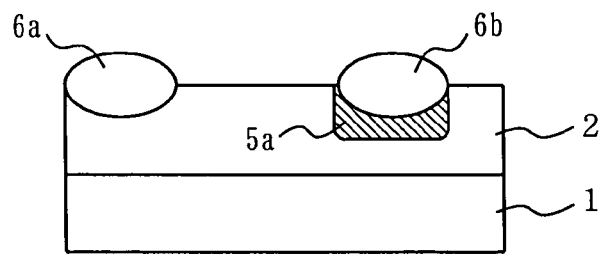

FIGS. 5A through 5E are cross-sectional views of a semiconductor substrate and elements formed thereon in steps of fabrication of the semiconductor device shown in FIG. 4. Hereinafter, with reference to FIGS. 5A through 5E, a method for fabricating the semiconductor device according to Embodiment 2 will be described. The steps shown in FIGS. 5A through 5C are the same as the steps shown in FIGS. 2A through 2C in Embodiment 1, and the descriptions thereof will be omitted.

Figure 5D:
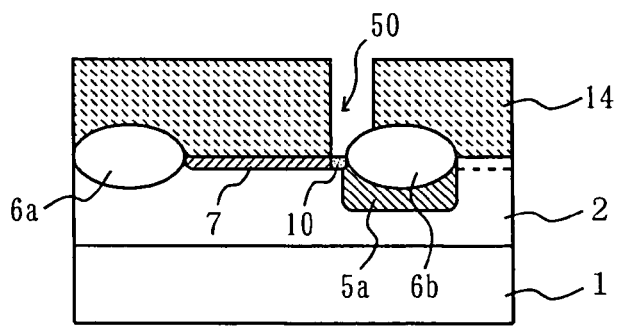

FIG. 5D shows a state where a resist pattern 14 patterned into a desired shape is formed, and the impurity layer 7 and the border impurity layer 10 are formed in the well diffusion layer 2. Such a structure is obtained as follows. First, using the LOCOS oxide films 6a and 6b as a mask, ions of an N type impurity (e.g., phosphorus, arsenic) are implanted into the well diffusion layer 2, thereby forming an N type impurity layer in the well diffusion layer 2. A part of the N type impurity layer which is present between the LOCOS oxide films 6a and 6b is the impurity layer 7 for adjusting the threshold voltage.

Next, a resist is applied so as to cover the surface of the resultant structure, thereby forming the resist pattern 14 having an opening 50 at least above an end of the channel region on the side of the low impurity concentration region 5a. Then, using the resist pattern 14 and the LOCOS oxide film 6b as a mask, ions of a P type impurity are implanted such that the surface impurity concentration is about $1\times10^{17}$ atoms/cm$^3$. Thus, the border impurity layer 10 is formed between the low impurity concentration region 5a and the impurity layer 7. The border impurity layer 10 overlaps both the low impurity concentration region 5a and the impurity layer 7. The border impurity layer 10 preferably has a width of equal to or less than about 1 μm.

Figure 5E:
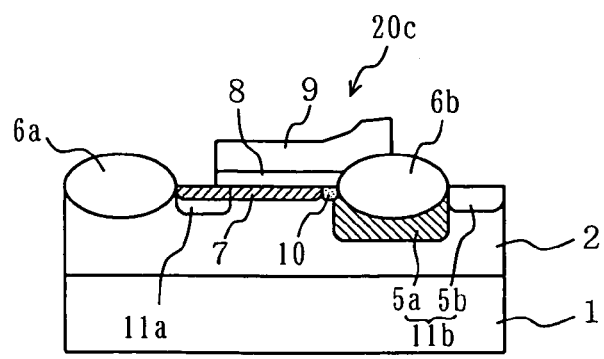

The step shown in FIG. 5E is the same as the step shown in FIG. 2E and will not be described here. By performing the same treatment as described above with reference to FIG. 2E, a high voltage transistor 20c having an offset structure is formed.

In the semiconductor device including the high voltage transistor 20c having the above-described structure, even if the impurity layer 7 and the low impurity concentration region 5a overlap each other, the impurity concentration of the low impurity concentration region 5a is increased owing to the border impurity layer 10. Therefore, the generation of the parasitic resistance is suppressed and thus the threshold voltage can be lowered. Since the width of the border impurity layer 10 is extremely small at equal to or less than about 1 μm, the surface concentration of the channel region is easily controlled.

In the above description, the border impurity layer 10 is provided in a portion where the low impurity concentration region 5a and the impurity layer 7 overlap each other. Alternatively, the impurity layer 7 and the low impurity concentration region 5a may be discrete from each other as described in Embodiment 1 and the border impurity layer 10 may be provided in the gap therebetween.

In the above embodiments, MOS type transistors processed with device isolation by LOCOS and having an offset structure are described. The present invention is also effective to MOS type transistors processed with device isolation by STI and having an offset structure.

In the above embodiments, P type MOS transistors are described. The present invention is also applicable to N type MOS transistors. In an N type MOS transistor, the impurity surface portion in the semiconductor substrate is of N type, and the source diffusion layer and the drain diffusion layer are of P type. A high voltage transistor including a CMOS transistor can be constructed in substantially the same manner as the transistors described above.

A semiconductor device according to the present invention has a feature of suppressing the generation of a parasitic resistance in a part of the drain diffusion layer on the channel region side and so maintaining the stable electric current driving capability of the high-voltage transistor. Therefore, the present invention is useful for, for example, a semiconductor device including a high voltage transistor having an offset structure realized by LOCOS or STI and a method for fabricating the same.

While the invention has been described in detail, the foregoing description is in all aspects illustrative and not restrictive. It is understood that numerous other modifications and variations can be devised without departing from the scope of the invention.

What is claimed is:

1. A semiconductor device including a high voltage transistor, the semiconductor device comprising:
    a semiconductor substrate having a first conductivity type surface portion;
    a second conductivity type source diffusion layer formed in the semiconductor substrate;
    a drain diffusion layer including a second conductivity type low impurity concentration region and a second conductivity type high impurity concentration region having a higher impurity concentration than that of the low impurity concentration region, wherein the low impurity concentration region is formed on the side of the source diffusion layer;
    a first conductivity type impurity layer provided between the source diffusion layer and the low impurity concentration region in the semiconductor substrate;
    a gate insulating film provided on the first conductivity type impurity layer; and
    a gate electrode provided on the gate insulating film;
    wherein the low impurity concentration region and the impurity layer are positioned so as not to compensate for the impurity of each other.

2. A semiconductor device according to claim 1, wherein the low impurity concentration region and the impurity layer are discrete from each other.

3. A semiconductor device according to claim 1, wherein the low impurity concentration region and the impurity layer contact each other.

4. A semiconductor device according to claim 1, further comprising a second conductivity type border impurity layer between the low impurity concentration region and the impurity layer.

5. A semiconductor device according to claim 1, further comprising an insulating film for device isolation in the semiconductor substrate, wherein the low impurity concentration region is provided below the insulating film.

6. A semiconductor device according to claim 1, wherein the low impurity concentration region and the impurity layer do not overlap each other in a vertical direction.

* * * * *